United States Patent
Kim et al.

(10) Patent No.: US 10,230,013 B2
(45) Date of Patent: Mar. 12, 2019

(54) SOLAR CELL MODULE

(71) Applicant: LG ELECTRONICS INC., Seoul (KR)

(72) Inventors: Bojoong Kim, Seoul (KR); Daehee Jang, Seoul (KR); Taeyoon Kim, Seoul (KR); Minpyo Kim, Seoul (KR); Hyeyoung Yang, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 451 days.

(21) Appl. No.: 14/326,265

(22) Filed: Jul. 8, 2014

(65) Prior Publication Data

US 2015/0013745 A1 Jan. 15, 2015

(30) Foreign Application Priority Data

Jul. 9, 2013 (KR) .................... 10-2013-0080463

(51) Int. Cl.
*H01L 31/05* (2014.01)
*H01L 31/068* (2012.01)

(52) U.S. Cl.
CPC ...... *H01L 31/0516* (2013.01); *H01L 31/0682* (2013.01); *Y02E 10/547* (2013.01)

(58) Field of Classification Search
CPC .................................................. H01L 31/0516
See application file for complete search history.

(56) References Cited

U.S. PATENT DOCUMENTS

| | | | |
|---|---|---|---|
| 2005/0268959 A1* | 12/2005 | Aschenbrenner | H01L 31/0508 136/244 |
| 2008/0216887 A1* | 9/2008 | Hacke | H01L 31/022441 136/244 |
| 2009/0050190 A1* | 2/2009 | Nishida | H01L 31/022433 136/244 |
| 2010/0018565 A1* | 1/2010 | Funakoshi | H01L 31/022433 136/244 |
| 2010/0108123 A1* | 5/2010 | Åsberg | H01L 31/0508 136/246 |
| 2010/0243028 A1* | 9/2010 | Sainoo | H01L 31/02245 136/244 |
| 2011/0073154 A1* | 3/2011 | Nishida | H01L 31/02245 136/244 |
| 2011/0073165 A1* | 3/2011 | Lee | H01L 31/022441 136/251 |
| 2013/0081675 A1* | 4/2013 | Joe | H01L 31/022441 136/251 |

(Continued)

*Primary Examiner* — Allison Bourke
(74) *Attorney, Agent, or Firm* — Birch, Stewart, Kolasch & Birch, LLP

(57) ABSTRACT

A solar cell module is discussed, and the solar cell module includes a plurality of solar cells each including an electron current collector and an hole current collector on a back surface of a semiconductor substrate and a connection member for connecting an electron current collector of one of two adjacent solar cells of the plurality of solar cells to a hole current collector of the other of the two adjacent solar cells of the plurality of solar cells. The connection member includes a printed circuit film including an insulating film and a conductive pattern disposed on the insulating film and a conductive adhesive for attaching the conductive pattern to the electron current collector and the hole current collector.

11 Claims, 4 Drawing Sheets

(56) References Cited

U.S. PATENT DOCUMENTS

| | | | |
|---|---|---|---|
| 2013/0213452 A1* | 8/2013 | Ide | H01L 31/0516 136/244 |
| 2014/0000682 A1* | 1/2014 | Zhao | H01L 31/0481 136/251 |
| 2014/0102508 A1* | 4/2014 | Ishii | H01L 31/048 136/244 |
| 2015/0059831 A1* | 3/2015 | Fukumochi | H01L 31/048 136/246 |

* cited by examiner

SOLAR CELL MODULE

CROSS-REFERENCE TO RELATED APPLICATION

This application claims priority to and the benefit of Korean Patent Application No. 10-2013-0080463 filed in the Korean Intellectual Property Office on Jul. 9, 2013, the entire contents of which are incorporated herein by reference.

BACKGROUND OF THE INVENTION

Field of the Invention

Embodiments of the invention relate to a solar cell module, and more particularly to a solar cell module including interdigitated back contact solar cells.

Description of the Related Art

Recently, as existing energy sources such as petroleum and coal are expected to be depleted, interests in alternative energy sources for replacing the existing energy sources are increasing. Among the alternative energy sources, solar cells for generating electric energy from solar energy have been particularly spotlighted.

A solar cell generally includes a substrate and an emitter region, which are formed of semiconductors of different conductive types, for example, a p-type and an n-type, and electrodes respectively connected to the substrate and the emitter region. A p-n junction is formed at an interface between the substrate and the emitter region.

When light is incident on the solar cell, electrons inside the semiconductor become free electrons (hereinafter referred to as "electrons") by the photoelectric effect. Further, electrons and holes respectively move to an n-type semiconductor (for example, the emitter layer) and a p-type semiconductor (for example, the substrate) based on a principle of the p-n junction. Then, the electrons and the holes are collected by the electrodes electrically connected to the emitter region and the substrate.

In recent times, an interdigitated back contact solar cell has been developed to increase a light receiving area and the efficiency of the solar cell by forming an electron current collector and a hole current collector on a back surface of the substrate (i.e., the back surface on which light is not incident).

SUMMARY OF THE INVENTION

Embodiments of the invention provide a solar cell module capable of reducing the manufacturing cost and improving its efficiency.

In one aspect, there is a solar cell module including a plurality of solar cells each including an electron current collector and an hole current collector on a back surface of a semiconductor substrate and a connection member configured to connect an electron current collector of one of two adjacent solar cells of the plurality of solar cells to a hole current collector of the other of the two adjacent solar cells of the plurality of solar cells, wherein the connection member includes a printed circuit film including an insulating film and a conductive pattern disposed on the insulating film and a conductive adhesive configured to attach the conductive pattern to the electron current collector and the hole current collector.

The conductive pattern may include a first pattern electrically connected to the electron current collector of the one of the two adjacent solar cells and a second pattern electrically connected to the hole current collector of the other of the two adjacent solar cells.

The conductive pattern may further include a connection pattern for connecting the first pattern with the second pattern.

The first pattern and the second pattern may be formed in a left-right symmetric manner with respect to a central line in a width direction of the insulating film.

Each of the first pattern and the second pattern may include a main pattern printed in a longitudinal direction of the insulating film and at least one sub-pattern connected to the main pattern.

A predetermined distance may be maintained between the main pattern of the first pattern and between the main pattern of the second pattern.

The at least one sub-pattern may include two first sub-patterns, which are respectively positioned at both ends of the main pattern in a longitudinal direction of the main pattern, and a second sub-pattern which is positioned in the middle of the main pattern in the longitudinal direction of the main pattern.

The first sub-patterns and the second sub-pattern may be perpendicular to the main pattern.

The connection pattern may connect the main pattern of the first pattern with the main pattern of the second pattern, or may connect the first sub-patterns of the first pattern with the first sub-patterns of the second pattern or connects the second sub-pattern of the first pattern with the second sub-pattern of the second pattern The first and second sub-patterns may be attached to the electron current collector or the hole current collector using the conductive adhesive.

The connection member may further include an interconnector which is attached to the first pattern and the second pattern using the conductive adhesive and electrically connects the first pattern with the second pattern.

The interconnector may be formed of a conductive metal of a straight shape, and a width of the conductive metal may be set to be equal to or less than a space between the two adjacent solar cells.

A back surface of the conductive metal may be attached to the first and second patterns using the conductive adhesive, and a front surface of the conductive metal may be formed as an uneven surface.

The interconnector may overlap an entire main pattern of the first pattern and an entire main pattern of the second pattern.

The interconnector may further overlap a portion of a first sub-pattern and a portion of a second sub-pattern of the first pattern and a portion of a first sub-pattern and a portion of a second sub-pattern of the second pattern.

The conductive adhesive may be positioned on an entire front surface of the first pattern and an entire front surface of the second pattern, or may be positioned on a portion of a front surface of the first pattern and a portion of a front surface of the second pattern.

According to the above-described characteristics of the embodiments of the invention, because two adjacent interdigitated back contact solar cells are electrically connected using the printed circuit film, a stress applied when the solar cells are electrically connected using the printed circuit film in a module process is further reduced, compared to a stress applied when a related art connection member formed of a conductive metal is used.

Furthermore, because a separate insulating film used to insulate the two adjacent interdigitated back contact solar cells may be removed, the manufacturing cost of the solar cell module may be reduced.

Furthermore, the electrical flow between the solar cells may be smoothly maintained by attaching the interconnector formed of the conductive metal of the straight shape to the printed circuit film.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Figure 1:
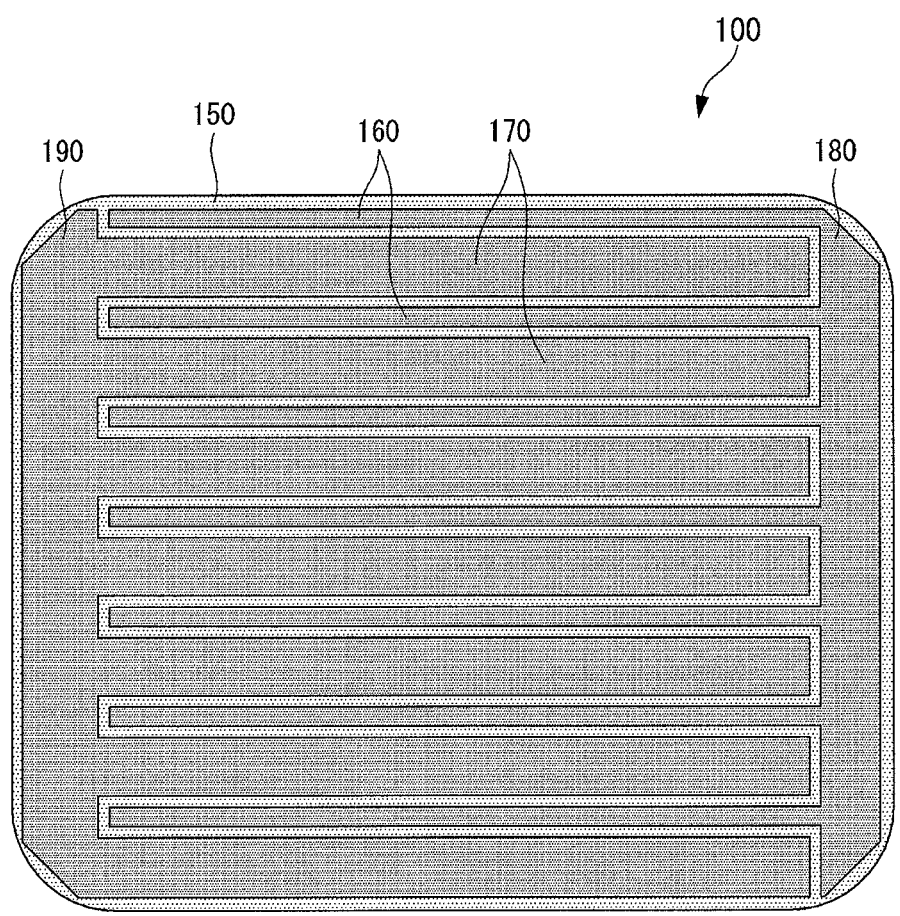
FIG. 1 shows a back surface of an interdigitated back contact solar cell.

Reference will now be made in detail to embodiments of the invention, examples of which are illustrated in the accompanying drawings. Since the invention may be modified in various ways and may have various forms, specific embodiments are illustrated in the drawings and are described in detail in this specification. However, it should be understood that the invention are not limited to specific disclosed embodiments, but include all modifications, equivalents and substitutes included within the spirit and technical scope of the invention.

The terms 'first', 'second', etc., may be used to describe various components, but the components are not limited by such terms. The terms are used only for the purpose of distinguishing one component from other components.

For example, a first component may be designated as a second component without departing from the scope of the embodiments of the invention. In the same manner, the second component may be designated as the first component.

The term "and/or" encompasses both combinations of the plurality of related items disclosed and any item from among the plurality of related items disclosed.

When an arbitrary component is described as "being connected to" or "being linked to" another component, this should be understood to mean that still another component(s) may exist between them, although the arbitrary component may be directly connected to, or linked to, the second component.

On the other hand, when an arbitrary component is described as "being directly connected to" or "being directly linked to" another component, this should be understood to mean that no component exists between them.

The terms used in this application are used to describe only specific embodiments or examples, and are not intended to limit the embodiments of the invention. A singular expression can include a plural expression as long as it does not have an apparently different meaning in context.

In this application, the terms "include" and "have" should be understood to be intended to designate that illustrated features, numbers, steps, operations, components, parts or combinations thereof exist and not to preclude the existence of one or more different features, numbers, steps, operations, components, parts or combinations thereof, or the possibility of the addition thereof.

In the drawings, the thickness of layers, films, panels, regions, etc., are exaggerated for clarity. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Unless otherwise specified, all of the terms which are used herein, including the technical or scientific terms, have the same meanings as those that are generally understood by a person having ordinary knowledge in the art to which the embodiments of the invention pertain.

The terms defined in a generally used dictionary must be understood to have meanings identical to those used in the context of a related art, and are not to be construed to have ideal or excessively formal meanings unless they are obviously specified in this application.

The following example embodiments of the invention are provided to those skilled in the art in order to describe the invention more completely. Accordingly, shapes and sizes of elements shown in the drawings may be exaggerated for clarity.

Example embodiments of the invention will be described with reference to FIGS. 1 to 7.

The following embodiments of the invention will describe an interdigitated back contact solar cell, in which all of a hole electrode, an electron electrode, an electron current collector, and a hole current collector are positioned on a back surface of a semiconductor substrate. However, the embodiments of the invention may be applied to a metal wrap through (MWT) solar cell, in which the hole electrode (or the electron electrode) is positioned on a front surface of the semiconductor substrate, and the electron electrode (or the hole electrode), the electron current collector, and the hole current collector are positioned on the back surface of the semiconductor substrate.

Hereinafter, an interdigitated back contact solar cell is described with reference to FIGS. 1 and 2.

FIG. 1 shows a back surface of an interdigitated back contact solar cell. FIG. 2 is a partial cross-sectional view of the interdigitated back contact solar cell shown in FIG. 1 in a longitudinal direction.

Figure 2:
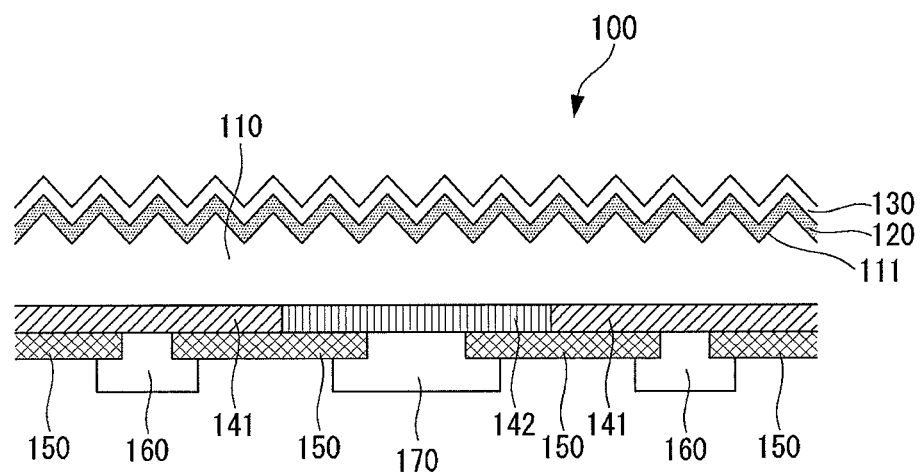
FIG. 2 is a partial cross-sectional view of the interdigitated back contact solar cell shown in FIG. 1 in a longitudinal direction.

As shown in FIGS. 1 and 2, an interdigitated back contact solar cell 100 includes a semiconductor substrate 110 of a first conductive type, a front dielectric layer 120 formed on a light receiving surface (for example, a front surface) of the semiconductor substrate 110, an anti-reflection layer 130 formed on the front dielectric layer 120, a plurality of first doped regions 141, each of which is formed at another surface (for example, a back surface) of the semiconductor substrate 110 and is heavily doped with impurities of the first conductive type, a plurality of second doped regions 142, each of which is formed at the back surface of the semiconductor substrate 110 at a position adjacent to the first doped region 141 and is heavily doped with impurities of a second conductive type opposite the first conductive type, a back dielectric layer 150 exposing a portion of each first doped region 141 and a portion of each second doped region 142, a plurality of electron electrodes 160 electrically connected to the first doped regions 141 exposed by the back dielectric layer 150, a plurality of hole electrodes 170 electrically connected to the second doped regions 142 exposed by the back dielectric layer 150, an electron current collector 180 electrically connecting one end of each of the plurality of electron electrodes 160, and an hole current collector 190 electrically connecting one end of each of the plurality of hole electrodes 170.

The light receiving surface of the semiconductor substrate 110 is textured to form a textured surface corresponding to an uneven surface including a plurality of uneven portions 111 or having uneven characteristics. Thus, the front dielectric layer 120 and the anti-reflection layer 130 each have a textured surface.

The semiconductor substrate 110 is formed of single crystalline silicon of the first conductive type, for example, n-type single crystalline silicon, though not required. On the contrary, the semiconductor substrate 110 may be of a p-type and/or may be formed of polycrystalline silicon. Further, the semiconductor substrate 110 may be formed of a semiconductor material other than silicon.

Because the light receiving surface of the semiconductor substrate 110 is formed as the textured surface including the plurality of uneven portions 111, an absorption of light increases. Hence, the efficiency of the solar cell is improved.

The front dielectric layer 120 formed at the light receiving surface of the semiconductor substrate 110 including the plurality of uneven portions 111 may be a region which is more heavily doped than the semiconductor substrate 110 with impurities of a group V element such as phosphorus (P), arsenic (As), and antimony (Sb). The front dielectric layer 120 may serve as a front surface field region similar to a back surface field region. Thus, electrons and holes separated by incident light are prevented from being recombined and/or disappeared at and around the light receiving surface of the semiconductor substrate 110.

The anti-reflection layer 130 formed on the surface of the front dielectric layer 120 may be formed of silicon nitride (SiNx) or silicon dioxide ($SiO_2$). The anti-reflection layer 130 reduces a reflectance of light incident on the solar cell and increases selectivity of light of a predetermined wavelength band, thereby increasing the efficiency of the solar cell.

The plurality of first doped regions 141 formed at the back surface of the semiconductor substrate 110 are more heavily doped than the semiconductor substrate 110 with n-type impurities, and the plurality of second doped regions 142 are heavily doped with p-type impurities. Thus, the second doped regions 142 form a p-n junction along with the semiconductor substrate 110.

The first doped regions 141 and the second doped regions 142 serve as a moving path of carriers (electrons and holes).

The back dielectric layer 150 exposing a portion of the first doped region 141 and a portion of the second doped region 142 may be formed of silicon nitride (SiNx), silicon dioxide ($SiO_2$), or a combination thereof.

The back dielectric layer 150 may serve as the back surface field region which prevents electrons and holes separated from the carriers from being recombined and/or disappeared, reflects light to the inside of the solar cell so that incident light is not leaked to the outside, and reduces an amount of the leaked light.

The back dielectric layer 150 may have a single-layered structure, but may alternatively have a multi-layered structure such as a double-layered structure or a triple-layered structure.

The electron electrode 160 is formed on the first doped region 141, which is not covered by the back dielectric layer 150, and also is formed on a portion of the back dielectric layer 150 adjacent to the first doped region 141. Further, the hole electrode 170 is formed on the second doped region 142, which is not covered by the back dielectric layer 150, and also is formed on a portion of the back dielectric layer 150 adjacent to the second doped region 142.

The electron current collector 180 electrically connecting one end of each of the plurality of electron electrodes 160 formed on the first doped regions 141, which are not covered by the back dielectric layer 150, is formed in a longitudinal direction of FIG. 1. Further, the hole current collector 190 electrically connecting one end of each of the plurality of hole electrodes 170 formed on the second doped regions 142, which are not covered by the back dielectric layer 150, is formed in the longitudinal direction of FIG. 1.

Accordingly, the electron electrode 160 and the electron current collector 180 are electrically connected to the first doped region 141, and the hole electrode 170 and the hole current collector 190 are electrically connected to the second doped region 142.

In this instance, the electron electrode 160 and the hole electrode 170 extend in one direction in parallel with each other at a predetermined distance therebetween, and the electron current collector 180 and the hole current collector 190 are respectively formed on both sides of the semiconductor substrate 110.

As described above, because a portion of the electron electrode 160 and a portion of the hole electrode 170 overlap a portion of the back dielectric layer 150, a contact resistance and a series resistance between the doped regions 141 and 142 and the electrodes 160 and 170 are reduced. Hence, the efficiency of the solar cell 100 increases.

Figure 3:
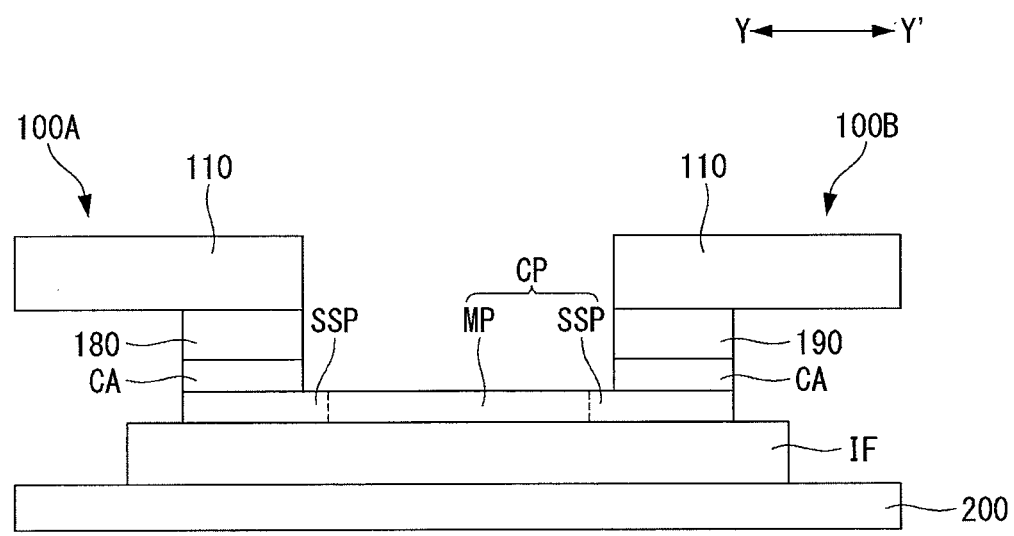
FIG. 3 is a cross-sectional view of a main part of a solar cell module according to a first embodiment of the invention.
Figure 4:
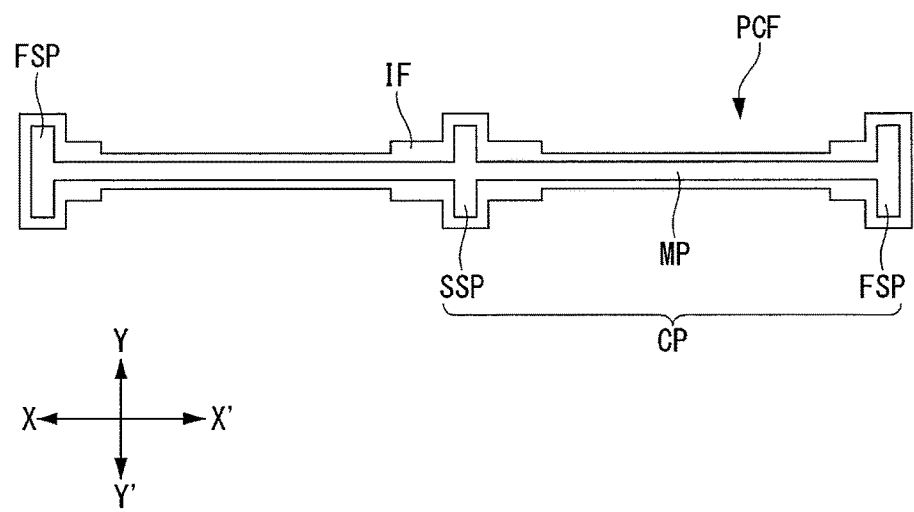
FIG. 4 is a plane view showing one configuration of a connection member used in the solar cell module shown in FIG. 3.
Figure 5:
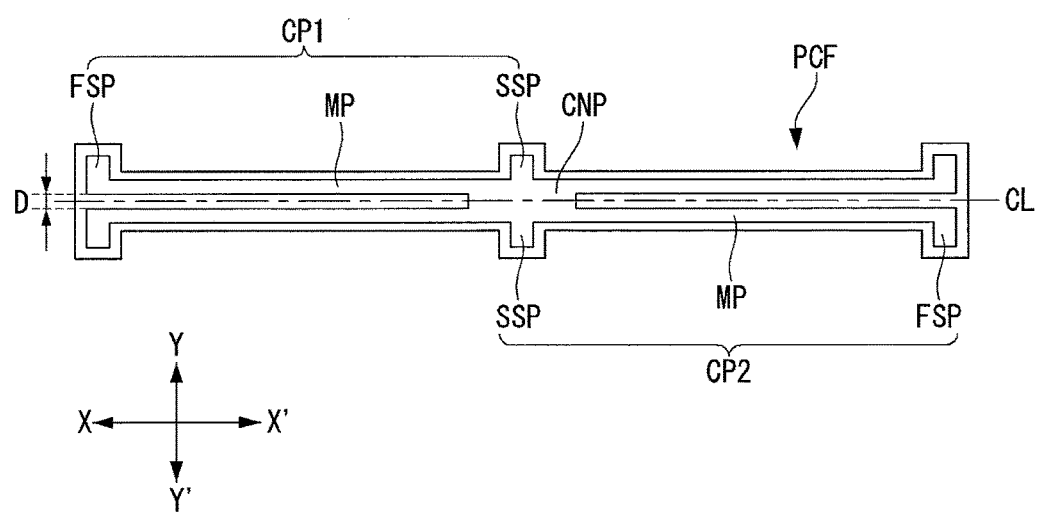
FIG. 5 is a plane view showing another configuration of a connection member used in the solar cell module shown in FIG. 3.

A first embodiment of the invention is described below with reference to FIGS. 3 to 5. FIG. 3 is a cross-sectional view of a main part of a solar cell module according to the first embodiment of the invention. FIG. 4 is a plane view showing one configuration of a connection member used in the solar cell module shown in FIG. 3. FIG. 5 is a plane view showing another configuration of the connection member used in the solar cell module shown in FIG. 3.

The solar cell module according to the first embodiment of the invention includes a connection member electrically connecting two adjacent interdigitated back contact solar cells. In the embodiment disclosed herein, one of the two adjacent interdigitated back contact solar cells is referred to as a first solar cell 100A, and the other solar cell is referred to as a second solar cell 100B.

The connection member is used to electrically connect an electron current collector 180 of the first solar cell 100A to a hole current collector 190 of the second solar cell 100B.

In the embodiment of the invention, the connection member includes a printed circuit film PCF including an insulating film IF and a conductive pattern CP printed on (or disposed on) the insulating film IF, and a conductive adhesive CA for attaching the electron current collector 180 and the hole current collector 190 to the conductive pattern CP.

The insulating film IF may be formed of a material, for example, a resin which is not deformed at a temperature capable of performing a module process of the solar cell module, for example, a temperature equal to or higher than about 300° C., preferably, a temperature equal to or higher than about 200° C.

As shown in FIG. 4, the conductive pattern CP may include a main pattern MP extending in a longitudinal direction X-X' of the insulating film IF, two first sub-patterns FSP which are respectively positioned at both ends of the main pattern MP and are formed in a width direction Y-Y' of the insulating film IF (i.e., a direction perpendicular to the main pattern MP), and a second sub-pattern SSP which is positioned in the middle of the main pattern MP in a longitudinal direction of the main pattern MP and is perpendicular to the main pattern MP.

When the first solar cell 100A and the second solar cell 100B are electrically connected to each other using the printed circuit film PCF including the conductive pattern CP of the above-described configuration, the first sub-pattern FSP positioned on the left side of the main pattern MP and the second sub-pattern SSP are electrically connected to the electron current collector 180 of the first solar cell 100A, and the first sub-patterns FSP positioned on the right side of the main pattern MP and the second sub-pattern SSP are electrically connected to the hole current collector 190 of the second solar cell 100B.

In the embodiment disclosed herein, the conductive adhesive CA is used to electrically connect the first sub-patterns FSP and the second sub-pattern SSP to the current collector 180 (or 190).

The conductive adhesive CA may include a thermosetting resin and a plurality of conductive particles distributed in the thermosetting resin.

In this instance, the thermosetting resin of the conductive adhesive CA is used to attach the first and second sub-patterns FSP and SSP to the current collector 180 (or 190), and the plurality of conductive particles of the conductive adhesive CA are used to electrically connect the first and second sub-patterns FSP and SSP to the current collector 180 (or 190).

Accordingly, in the embodiment of the invention, the first solar cell 100A and the second solar cell 100B are electrically connected to each other along a current path sequentially passing through the electron current collector 180 of the first solar cell 100A, the conductive adhesive CA, the first and second sub-patterns FSP and SSP, the main pattern MP, the first and second sub-patterns FSP and SSP, the conductive adhesive CA, and the hole current collector 190 of the second solar cell 100B.

In FIG. 3, a reference numeral 200 denotes a back sheet positioned on a back surface of the solar cell module.

Unlike the configuration of the connection member shown in FIG. 4, as shown in FIG. 5, the conductive pattern CP may include a first pattern CP1 electrically connected to the electron current collector 180 of the first solar cell 100A, a second pattern CP2 electrically connected to the hole current collector 190 of the second solar cell 100B, and a connection pattern CNP for connecting the first pattern CP1 with the second pattern CP2.

The first pattern CP1 and the second pattern CP2 are formed in a left-right symmetric manner with respect to a central line CL of the width direction Y-Y' of the insulating film IF. Each of the first pattern CP1 and the second pattern CP2 may include the main pattern MP printed in the longitudinal direction X-X' of the insulating film IF and at least one sub-pattern connected to the main pattern MP.

For example, FIG. 5 shows that the first pattern CP1 and the second pattern CP2 each include the two first sub-patterns FSP connected to both ends of the main pattern MP and the second sub-pattern SSP positioned in the middle of the longitudinal direction X-X' of the main pattern MP.

A predetermined distance D is maintained between the main pattern MP of the first pattern CP1 and between the main pattern MP of the second pattern CP2.

As shown in FIG. 5, the connection pattern CNP may connect the main pattern MP of the first pattern CP1 with the main pattern MP of the second pattern CP2.

However, the connection pattern CNP may connect the first sub-patterns FSP of the first pattern CP1 with the first sub-patterns FSP of the second pattern CP2 or may connect the second sub-pattern SSP of the first pattern CP1 with the second sub-pattern SSP of the second pattern CP2 . Further, the first pattern CP1 and the second pattern CP2 may be connected to each other using the plurality of connection patterns CNP.

The first and second sub-patterns FSP and SSP may be attached to the electron current collector 180 or the hole current collector 190 using the conductive adhesive CA.

For example, the first and second sub-patterns FSP and SSP of the first pattern CP1 may be attached to the electron current collector 180 of the first solar cell 100A using the conductive adhesive CA, and the first and second sub-patterns FSP and SSP of the second pattern CP2 may be attached to the hole current collector 190 of the second solar cell 100B using the conductive adhesive CA.

Accordingly, in the embodiment of the invention, the first solar cell 100A and the second solar cell 100B are electrically connected to each other along a current path sequentially passing through the electron current collector 180 of the first solar cell 100A, the conductive adhesive CA, the first pattern CP1 , the connection pattern CNP, the second pattern CP2 , the conductive adhesive CA, and the hole current collector 190 of the second solar cell 100B.

Figure 6:
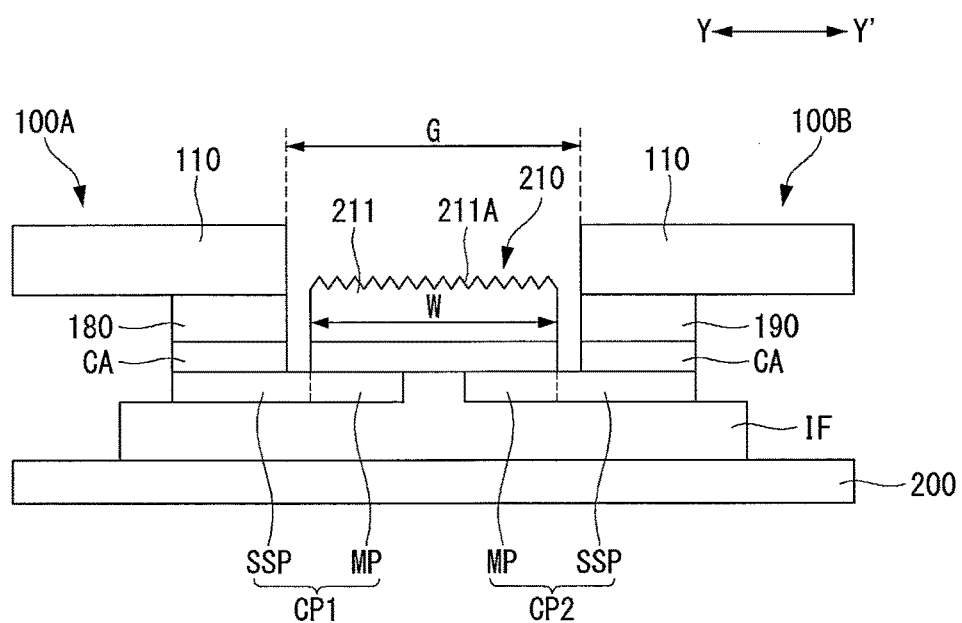
FIG. 6 is a cross-sectional view of a main part of a solar cell module according to a second embodiment of the invention.
Figure 7:
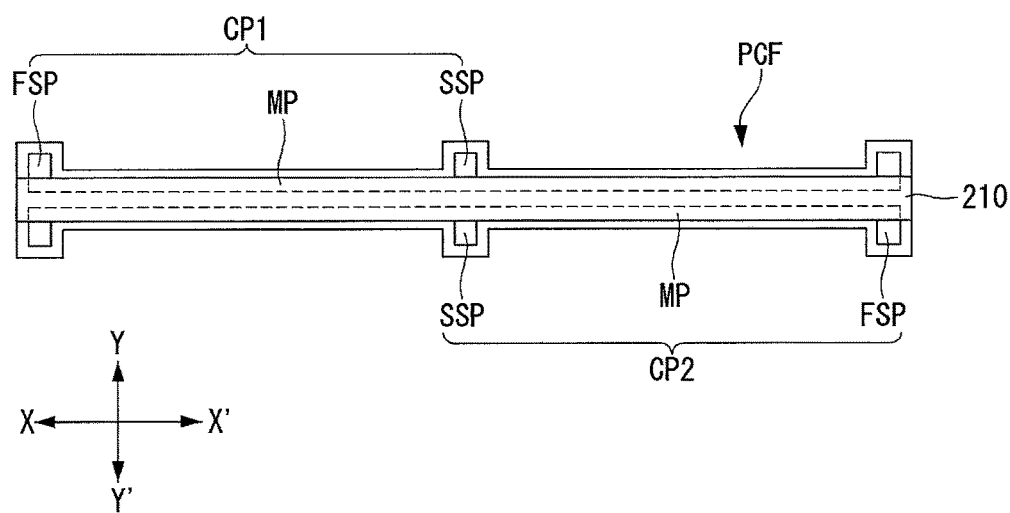
FIG. 7 is a plane view showing one configuration of a connection member used in the solar cell module shown in FIG. 6.

A second embodiment of the invention is described below with reference to FIGS. 6 and 7. FIG. 6 is a cross-sectional view of a main part of a solar cell module according to the second embodiment of the invention. FIG. 7 is a plane view showing one configuration of a connection member used in the solar cell module shown in FIG. 6.

The solar cell module according to the second embodiment of the invention further includes an interconnector 210 attached to a conductive pattern of a printed circuit film PCF using a conductive adhesive CA.

In this instance, the printed circuit film PCF may include the conductive pattern CP shown in FIG. 4 or the first and second patterns CP1 and CP2 and the connection pattern CNP shown in FIG. 5. Alternatively, as shown in FIG. 6, the printed circuit film PCF may include only first and second patterns CP1 and CP2 . Namely, the connection pattern CNP may be omitted in the configuration of the printed circuit film PCF shown in FIG. 5. The reason is that the first pattern CP1 is electrically connected to the second pattern CP2 by the interconnector 210.

The interconnector 210 may be formed of a conductive metal 211 of a straight shape. A width W of the conductive metal 211 is set to be equal to or less than a space G (i.e., a distance) between a first solar cell 100A and a second solar cell 100B.

A back surface of the conductive metal 211 of the interconnector 210 is attached to the first and second patterns CP1 and CP2 using a conductive adhesive CA.

In this instance, the interconnector 210 may overlap an entire main pattern MP of the first pattern CP1 and an entire main pattern MP of the second pattern CP2. In addition, the interconnector 210 may overlap a portion of a first sub-pattern FSP and a portion of a second sub-pattern SSP of the first pattern CP1 and a portion of a first sub-pattern FSP and a portion of a second sub-pattern SSP of the second pattern CP2.

The conductive adhesive CA may be positioned on entire front surfaces of the first and second patterns CP1 and CP2 or may be partially positioned on a portion of each front surface of the first and second patterns CP1 and CP2.

When the conductive adhesive CA is positioned on the entire front surfaces of the first and second patterns CP1 and CP2, an adhesion area between the first and second patterns CP1 and CP2 and the interconnector 210 increases. Hence, a transfer efficiency of carriers is improved. When the conductive adhesive CA is partially positioned on the portion of each front surface of the first and second patterns CP1 and CP2, the manufacturing cost of the solar cell module may be reduced because an amount of the conductive adhesive CA used decreases.

Accordingly, in the embodiment of the invention, the first solar cell 100A and the second solar cell 100B are electrically connected to each other along a current path sequentially passing through the electron current collector 180 of the first solar cell 100A, the conductive adhesive CA, the first pattern CP1, the conductive adhesive CA, the interconnector 210, the second pattern CP2, the conductive adhesive CA, and the hole current collector 190 of the second solar cell 100B.

Further, when the printed circuit film PCF further includes the connection pattern CNP for electrically connecting the first pattern CP1 to the second pattern CP2, the first solar cell 100A and the second solar cell 100B are electrically connected to each other along a current path sequentially passing through the electron current collector 180 of the first solar cell 100A, the conductive adhesive CA, the first pattern CP1, the connection pattern CNP, the second pattern CP2, the conductive adhesive CA, and the hole current collector 190 of the second solar cell 100B.

A front surface of the conductive metal 211 of the interconnector 210 is formed as an uneven surface 211A.

As described above, when the conductive metal 211 of the interconnector 210 has the uneven surface 211A, light incident on the space G between the first solar cell 100A and the second solar cell 100B is reflected and scattered from the uneven surface 211A. Therefore, an amount of light incident on the first solar cell 100A and the second solar cell 100B may increase.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A solar cell module comprising:
    a plurality of solar cells each including a plurality of hole electrodes and a plurality of electron electrodes alternately arranged in a first direction, an electron current collector and a hole current collector connecting one end of each of the plurality of hole electrodes and the plurality of electron electrodes in the first direction, and on a back surface of a semiconductor substrate;
    a connection member electrically connecting an electron current collector of one of two adjacent solar cells of the plurality of solar cells to a hole current collector of the other of the two adjacent solar cells of the plurality of solar cells with a conductive pattern; and
    a conductive adhesive configured to attach the connection member to the electron current collector and the hole current collector,
    wherein each connection member is disposed between the two adjacent solar cells, and includes an insulating film extending in the first direction and the conductive pattern disposed on the insulating film,
    wherein the conductive pattern includes first and second patterns arranged apart from each other and disposed on the insulating film, and an interconnector is disposed on the each of a main pattern portion of the first and second patterns to electrically connect the first pattern with the second pattern, and is disposed between the two adjacent solar cells,
    wherein each of the first and second patterns includes:
        the main pattern portion extending in the first direction in parallel with the electron current collector of the one of the two adjacent solar cells and the hole current collector of the other of the two adjacent solar cells, and
        a plurality of sub-pattern portions each protruding from the main pattern portion in a second direction, each sub-pattern portion being overlapped with the electron current collector of the one of the two adjacent solar cells and the hole current collector of the other of the two adjacent solar cells,
    wherein the insulating film includes a first portion on which the main pattern portion is printed and a plurality of second portions on which the plurality of sub-pattern portions are printed, each of the plurality of second portions protruding from the first portion in the second direction,
    wherein the first and second patterns have a shape that is mirror symmetrical in the first direction, and
    wherein the conductive adhesive is provided between the plurality of pattern portions and the electron current collector and the hole current collector.

2. The solar cell module of claim 1, wherein the interconnector is formed of a conductive metal of a straight shape, and a width of the conductive metal is set to be equal to or less than a space between the two adjacent solar cells.

3. The solar cell module of claim 2, wherein a back surface of the interconnector is attached to the first and second patterns using the conductive adhesive, and a front surface of the interconnector has an uneven surface.

4. The solar cell module of claim 3, wherein the interconnector overlaps an entire main pattern portion of the first pattern and an entire main pattern portion of the second pattern.

5. The solar cell module of claim 4, wherein the interconnector further overlaps a portion of a first sub-pattern portion and a portion of a second sub-pattern portion of the first pattern and a portion of a first sub-pattern portion and a portion of a second sub-pattern portion of the second pattern.

6. The solar cell module of claim 1, wherein the conductive adhesive is positioned on an entire front surface of the first pattern and an entire front surface of the second pattern.

7. The solar cell module of claim 1, wherein the conductive adhesive is positioned on a portion of a front surface of the first pattern and a portion of a front surface of the second pattern.

8. The solar cell module of claim 1, wherein a sum of a width of the main pattern portion of the first and second patterns is less than a width of the interconnector.

9. The solar cell module of claim 1, wherein a shape of the conductive pattern corresponds to a shape of the insulating film.

10. The solar cell module of claim 1, wherein a portion of the insulating film is interposed between the first pattern and the second pattern to separate the first pattern from the second pattern.

11. The solar cell module of claim 1, wherein the conductive adhesive is configured to attach the insulating film to the interconnector.

* * * * *